(12) United States Patent
Choi et al.

(10) Patent No.: US 7,419,896 B2
(45) Date of Patent: Sep. 2, 2008

(54) METHOD FOR FORMING LANDING PLUG CONTACT IN SEMICONDUCTOR DEVICE

(75) Inventors: Ik-Soo Choi, Kyoungki-do (KR); Chang-Youn Hwang, Kyoungki-do (KR); Hong-Gu Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 45 days.

(21) Appl. No.: 11/176,714

(22) Filed: Jul. 6, 2005

(65) Prior Publication Data

US 2006/0141696 A1 Jun. 29, 2006

(30) Foreign Application Priority Data

Dec. 28, 2004 (KR) .................. 10-2004-0113522

(51) Int. Cl.
*H01L 21/3205* (2006.01)
*H01L 21/4763* (2006.01)

(52) U.S. Cl. .................. 438/586; 438/597; 438/706; 257/E21.649

(58) Field of Classification Search .................. 438/706, 438/238, 586, 597, FOR. 220
See application file for complete search history.

(56) References Cited

U.S. PATENT DOCUMENTS

| | | | | |
|---|---|---|---|---|
| 5,918,120 A * | 6/1999 | Huang | .................. | 438/239 |
| 6,407,420 B1 * | 6/2002 | Yamanaka et al. | .................. | 257/296 |
| 6,844,229 B2 * | 1/2005 | Lee et al. | .................. | 438/239 |
| 7,119,015 B2 * | 10/2006 | Park et al. | .................. | 438/672 |
| 7,186,655 B2 * | 3/2007 | Kim et al. | .................. | 438/693 |
| 2002/0093099 A1 * | 7/2002 | Juengling et al. | .................. | 257/752 |
| 2004/0102039 A1 * | 5/2004 | Lim et al. | .................. | 438/674 |
| 2005/0090055 A1 * | 4/2005 | Lee et al. | .................. | 438/256 |

\* cited by examiner

*Primary Examiner*—Michelle Estrada
(74) *Attorney, Agent, or Firm*—Blakely, Sokoloff, Taylor & Zafman

(57) ABSTRACT

A method for forming a landing contact plug in a semiconductor device is provided. The method includes the steps of: forming a plurality of gate structures on a substrate, each gate structure including a gate hard mask; forming an inter-layer insulation layer over the gate structures; planarizing the inter-layer insulation layer until the gate hard mask is exposed; forming an etch barrier layer on the inter-layer insulation layer; etching a predetermined portion of the inter-layer insulation layer by using the etch barrier layer as an etch barrier to form a plurality of contact holes; forming a conductive layer until the conductive layer fills the contact holes; removing surface roughness created during the formation of the conductive layer by a first etch-back process; and planarizing the conductive layer by a second etch-back process until the gate hard mask is exposed.

9 Claims, 4 Drawing Sheets

1ST ETCH-BACK PROCESS

2ND ETCH-BACK PROCESS

METHOD FOR FORMING LANDING PLUG CONTACT IN SEMICONDUCTOR DEVICE

FIELD OF THE INVENTION

The present invention relates to a method for fabricating a semiconductor device; and, more particularly, to a method for forming a landing plug contact in a semiconductor device.

DESCRIPTION OF RELATED ARTS

As semiconductor devices have become highly integrated, device elements of the semiconductor device are increasingly formed within a limited area. Thus, the sizes of the device elements such as transistors and capacitors have also been scaled down. Especially, in a semiconductor memory device such as a dynamic random access memory device (DRAM), this decreasing design rule has caused line widths of circuits formed in a cell region to be shrunk to below 0.1 μm, even requiring a line width below 70 nm.

FIG. 1 is a top view showing a layout of landing plug contact (LPC) masks. FIGS. 2A and 2B are cross-sectional views illustrating a conventional method for forming LPCs. Especially, these cross-sectional views are taken along a line A-A' shown in FIG. 1. With reference to FIGS. 1 and 2A and 2B, the LPC formation method will be described in detail.

Referring to FIG. 2A, a plurality of gate structure G are formed on a substrate 11, and then, an etch stop layer 16 is formed over the gate structures G. Afterwards, an inter-layer insulation layer 17 is formed on the etch stop layer 16. Each of the gate structures G includes a gate oxide layer 12, a gate polysilicon layer 13, a gate tungsten silicide layer 14 and a gate hard mask layer 15. Herein, the etch stop layer 16 and the gate hard mask layer 15 are nitride-based layers.

Subsequently, the inter-layer insulation layer 17 is subjected to a chemical mechanical polishing (CMP) process performed until the gate hard mask layer 15 is exposed. At this time, the CMP process utilizes a predetermined slurry with high selectivity with respect to nitride. A polysilicon layer 18 for use in a hard mask is then formed on the planarized inter-layer insulation layer 17.

Next, a photolithography process is performed on the polysilicon layer 18 by using a LPC mask 19, and this patterned polysilicon layer 18 is used as an etch barrier when the inter-layer insulation layer 17 disposed in LPC regions is selectively etched. Through this selective etching of the inter-layer insulation layer 17, a plurality of contact holes 20 for LPCs are formed.

Afterwards, the LPC mask 19 is removed, and an undoped silicate glass (USG) layer 21 is formed on an entire surface of the above resulting substrate structure. Herein, the USG layer 21 functions as a buffer oxide layer for preventing the nitride-based gate hard mask layer 15 from being damaged when the etch stop layer 16 is removed. An etch-back process is performed on the USG layer 21, so that the USG layer 21 remains inside the contact holes 20.

Referring to FIG. 2B, although not illustrated, another polysilicon layer is formed over the above resulting substrate structure until being filled into the contact holes 20, and the CMP process is performed again by using the nitride-based gate hard mask layer 15 as an etch stop layer. After the CMP process, a plurality of LPCs 22 are formed.

However, the above-described conventional method has a problem in that a difference in height between the nitride-based gate hard mask layer 15 and the individual LPC 22 arises because of a discrepancy in an etch rate and a polishing rate between the nitride-based gate hard mask layer 15 and said another polysilicon layer during the CMP process for forming the LPCs 22. That is, the etch rate and the polishing rate of the polysilicon layer used for forming the LPCs 22 are chemically and mechanically higher than those of the nitride-based gate hard mask layer 15 during the CMP process. Hence, the polysilicon layer for the LPCs 22 is polished faster than the gate hard mask layer 15, resulting in approximately 300 Å of the height difference between the gate hard mask layer 15 and the individual LPC 22. A reference numeral 23 denotes this height difference, which is commonly called dishing.

Also, this height difference may cause the gate hard mask layer 15 to be increasingly exposed, being one factor for decreasing a self-aligned contact (SAC) margin during a SAC etching process for forming subsequent bit line contact holes.

SUMMARY OF THE INVENTION

It is, therefore, an object of the present invention to provide a method for forming a landing plug contact in a semiconductor device capable of preventing creation of a difference in height between a landing plug contact material and a gate hard mask.

In accordance with an aspect of the present invention, there is provided a method for forming a landing plug contact in a semiconductor device, including the steps of: forming a plurality of gate structures on a substrate, each gate structure including a gate hard mask; forming an inter-layer insulation layer over the gate structures; planarizing the inter-layer insulation layer until the gate hard mask is exposed; forming an etch barrier layer on the inter-layer insulation layer; etching a predetermined portion of the inter-layer insulation layer by using the etch barrier layer as an etch barrier to form a plurality of contact holes; forming a conductive layer until the conductive layer fills the contact holes; removing surface roughness created during the formation of the conductive layer by a first etch-back process; and planarizing the conductive layer by a second etch-back process until the gate hard mask is exposed.

In accordance with another aspect of the present invention, there is provided a method for forming a landing plug contact in a semiconductor device, including the steps of: forming a plurality of gate structures on a substrate, each gate structure including a gate hard mask; forming an inter-layer insulation over the gate structures; planarizing the inter-layer insulation layer until the gate hard mask is exposed; forming an etch barrier layer on the inter-layer insulation layer; etching a predetermined portion of the inter-layer insulation layer by using the etch barrier layer as an etch barrier to form a plurality of contact holes; forming a polysilicon layer for forming the landing plug contacts until the polysilicon layer fills the contact holes; removing surface roughness created during the formation of the polysilicon layer by a first etch-back process; and planarizing the polysilicon layer by a second etch-back process until the gate hard mask is exposed.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for forming a landing plug contact in a semiconductor device in accordance with a preferred embodiment of the present invention will be described in detail with reference to the accompanying drawings.

FIGS. 3A to 3D are cross-sectional views illustrating a method for forming landing plug contacts (LPCs) in accordance a preferred embodiment of the present invention.

Figure 1:
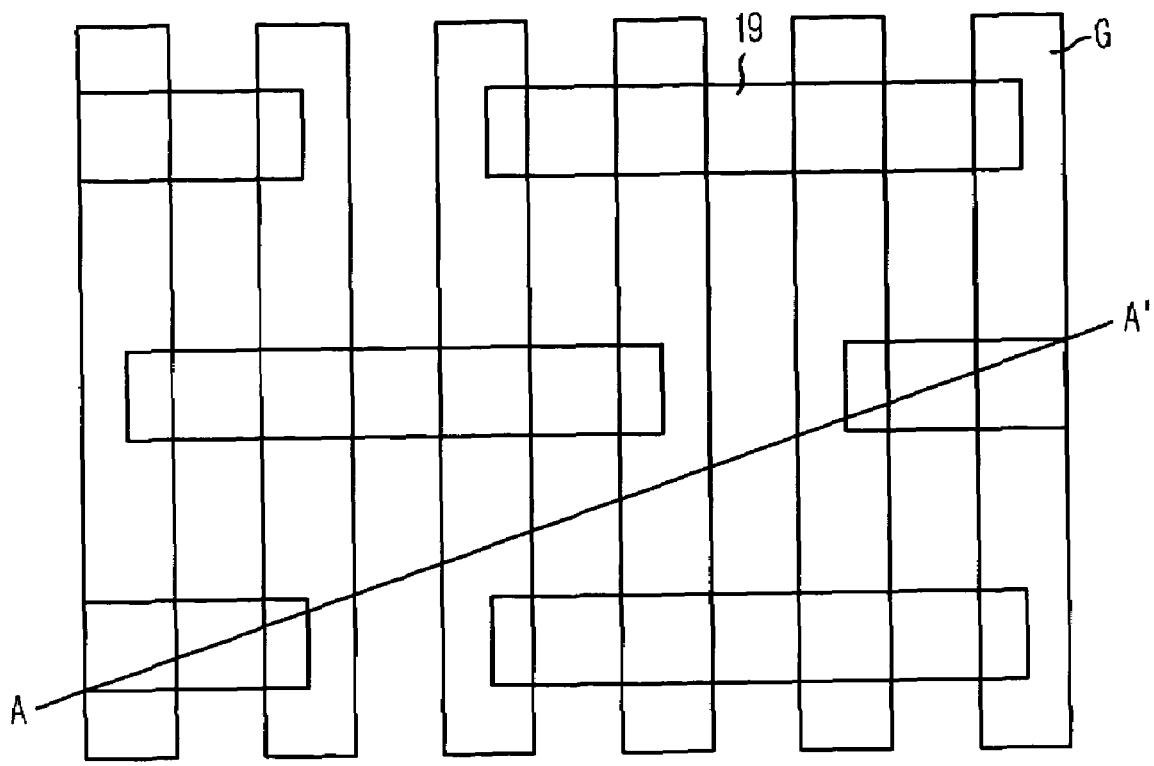
FIG. 1 is a top view showing a layout of conventional landing plug contact masks.
Figure 2A:
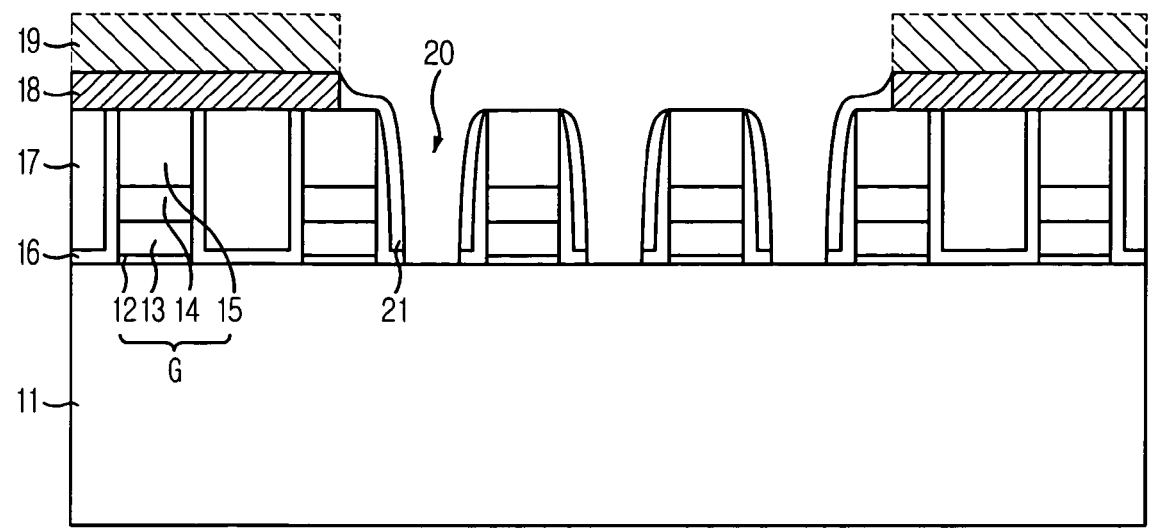
FIGS. 2A and 2B are cross-sectional views illustrating a conventional method for forming landing plug contacts by using the landing plug contact masks shown in FIG. 1.
Figure 2B:
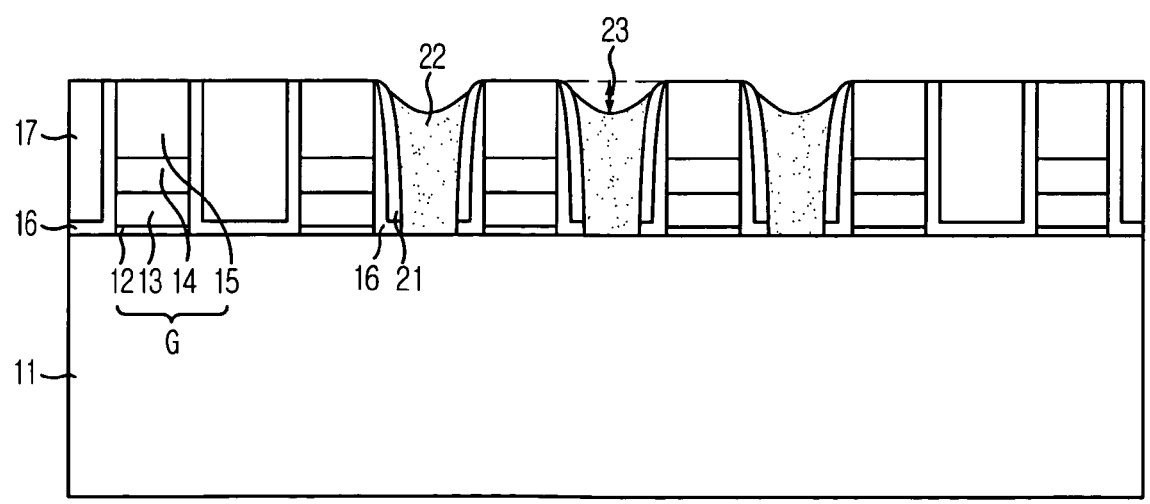
Figure 3A:
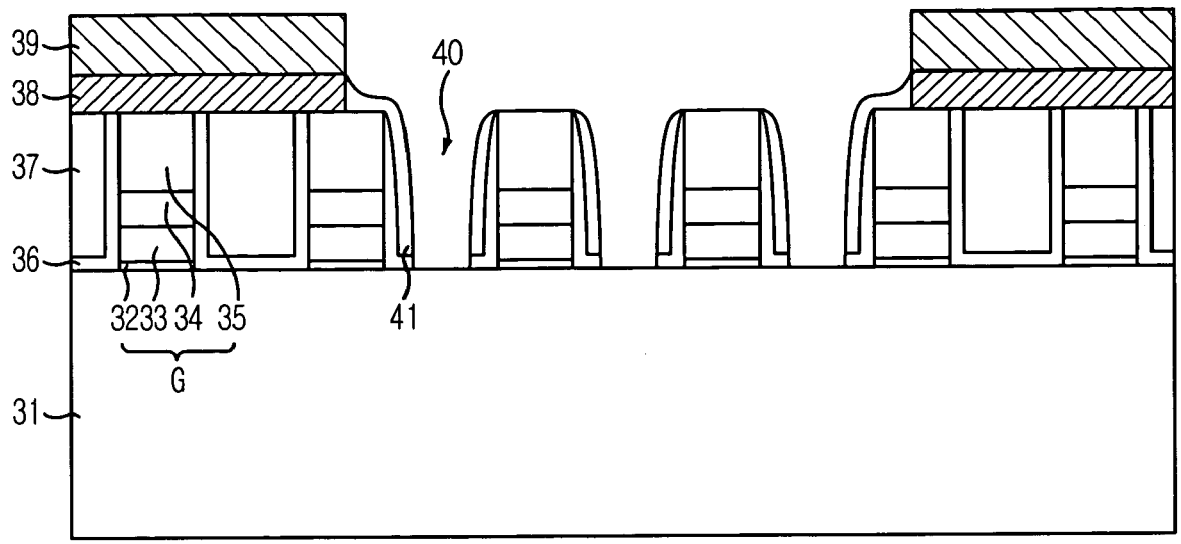
FIGS. 3A to 3D are cross-sectional views illustrating a method for forming landing plug contacts in accordance with a preferred embodiment of the present invention.

Referring to FIG. 3A, a plurality of gate structures G are formed on a substrate 31. Herein, the gate structures G are obtained through sequentially stacking an oxide-based gate insulation layer 32, a gate polysilicon layer 33, a gate tungsten silicide layer 34 and a nitride-based gate hard mask layer 35 and then, performing a gate patterning process thereon.

Next, a nitride-based etch stop layer 36 and an inter-layer insulation layer 37 are sequentially formed over the gate structures G. Then, a chemical mechanical polishing (CMP) process is performed on the inter-layer insulation layer 37 and the etch stop layer 36 until the gate hard mask layer 35 is exposed. At this time, the CMP process utilizes a predetermined slurry that has high selectivity with respect to nitride. Especially, such CMP process is often called an inter-layer dielectric (ILD) CMP process.

Subsequent to the CMP process, a first polysilicon layer 38 for use in a hard mask is formed on the planarized inter-layer insulation layer 37. A photolithography process using a landing plug contact (LPC) mask 39 is performed to pattern the first polysilicon layer 38 as in the shape of the LPC mask 39, and a portion of the inter-layer insulation layer 37 disposed in a LPC region is selectively etched by using the patterned first polysilicon layer 38 as an etch barrier. From this selective etching of the inter-layer insulation layer 37, a plurality of contact holes 40 for use in LPCs are formed. In the case that the patterned first polysilicon layer 38 is used as the etch barrier as described above, the above selective etching for forming the plurality of contact holes 40 can be carried out after the LPC mask 39 is stripped. That is, the patterned first polysilicon layer 38 serves as an etch barrier layer during the selective etching process.

Although the preferred embodiment shows the contact hole formation process is carried out under a direct polysilicon hard mask (DPH) mode with the application of the first polysilicon layer 38 for forming the contact holes 40, such a direct nitride hard mask (DNH) mode or a direct photoresist (DP) mode can be still applicable for forming the contact holes 40. Herein, the DNH mode utilizes nitride for use in a hard mask as an etch barrier layer instead of polysilicon for use in a hard mask. Also, according to the DP mode, the photoresist is solely used for the etching process without employing the hard mask.

After the selective etching process, a buffer oxide layer 41 is formed over the above resulting substrate structure to prevent the gate hard mask layer 35 from being damaged when the etch stop layer 36 is etched. Herein, undoped silicate glass (USG) is one exemplary material for the buffer oxide layer 41. An etch-back process is then performed on the buffer oxide layer 41. Through this etch-back process, the buffer oxide layer 41 remains on inner sidewalls of the contact holes 40, so that the buffer oxide layer 41 covers the upper lateral portions of the gate hard mask layer 35.

Afterwards, the etch stop layer 36 exposed at the bottom of each contact hole 40 by the etch-back process is etched away, thereby opening the contact holes 40.

Figure 3B:
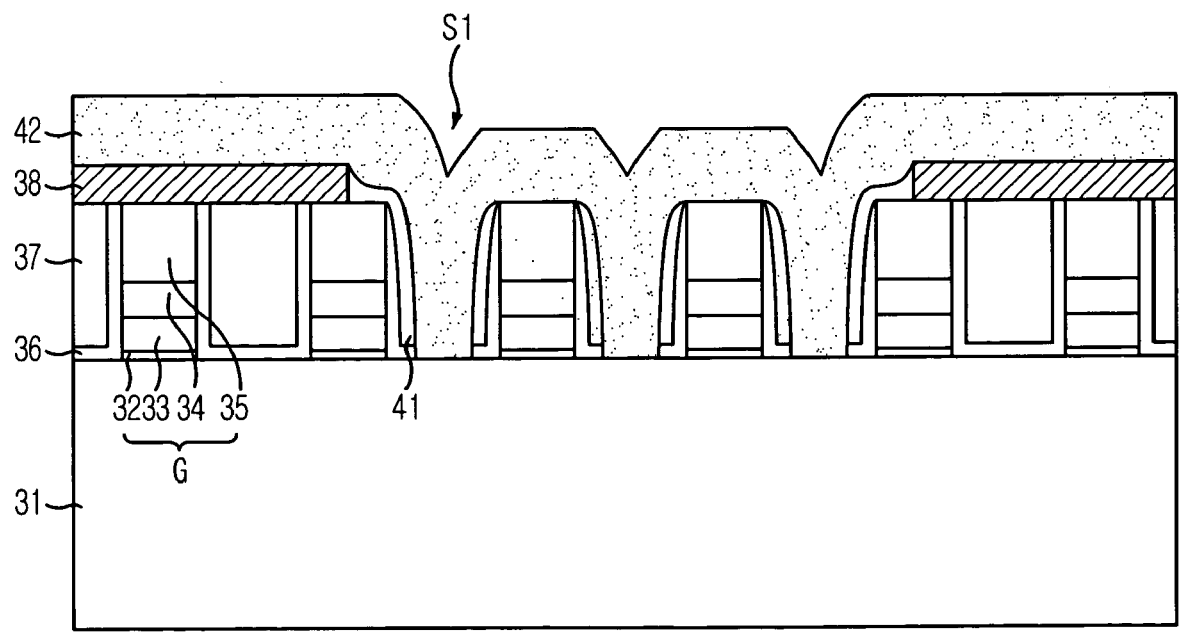

Referring to FIG. 3B, a second polysilicon layer 42 is formed until the contact holes 40 are filled. In the course of forming the second polysilicon layer 42, seams S1 are generated because of the resulting topology of the bottom structure obtained after the etch-back process. After the second polysilicon layer 42 is formed, a predetermined process is performed to form the aforementioned LPCs.

In more detail of the LPC formation process, instead of employing the CMP process to remove the second polysilicon layer 42, an etch-back process is applied in this preferred embodiment. Since the CMP process typically results in a difference in height between the gate hard mask layer 35 and the second polysilicon layer 42, an etch-back process capable of preventing an incidence of the height difference is employed instead. The etch-back process is known as a process that can easily control an etch selectivity ratio between etch-back target materials in comparison with the typical CMP process. Preferably, the etch-back process for forming the LPCs is carried out in two steps with the goal of eliminating the height difference between the gate hard mask layer 35 and the second polysilicon layer 42.

Figure 3C:
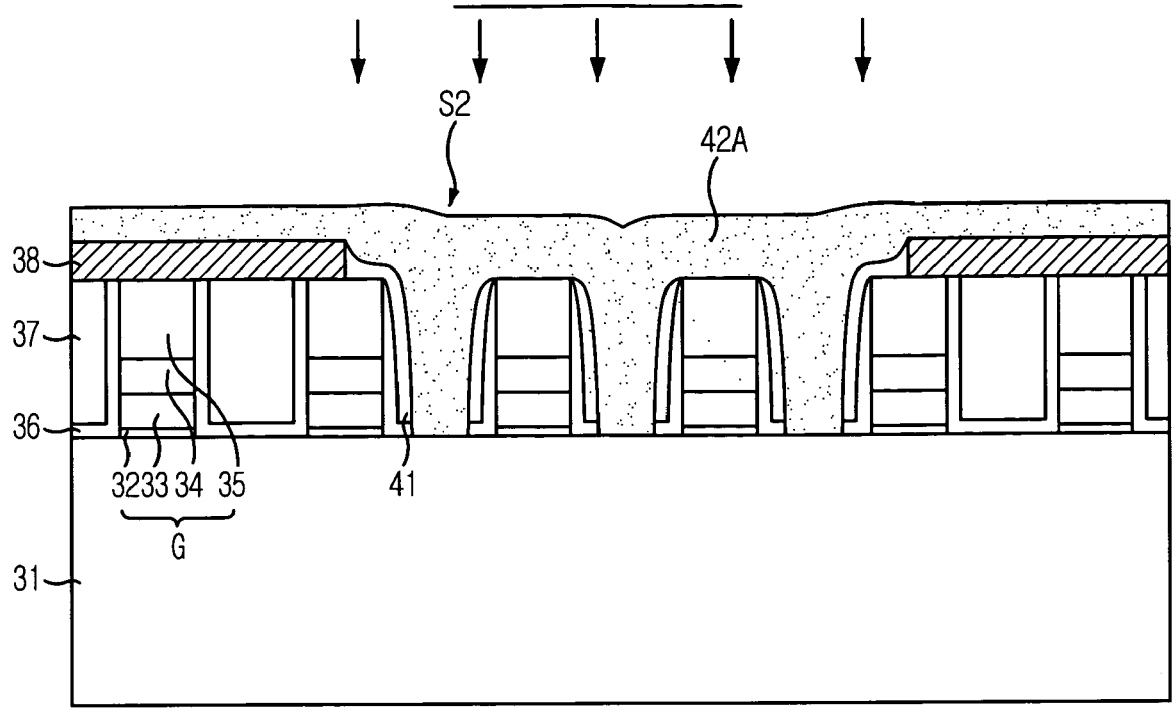

Referring to FIG. 3C, the second polysilicon layer 42 of FIG. 3B is subjected to a first etch-back process to cause the polysilicon layer 42 shown in FIG. 3B to remain in several angstroms on the first polysilicon layer 38. At this time, a remaining portion of the second polysilicon layer 42, denoted with a reference numeral 42A, has a thickness ranging from approximately 50 Å to approximately 90 Å. However, it should be noted that the thickness of the remaining second polysilicon layer 42A varies depending on the depth of the seams S1. However, since the first etch-back process is applied to remove surface roughness such as the seams S1, the first polysilicon layer 38 may not remain.

Specifically, the first etch-back process is carried out under a predetermined recipe that causes the seams S1 of the second polysilicon layer 42 shown in FIG. 3B to be removed to a predetermined depth. This remaining portion of the initially generated seams S1 is expressed as a reference denotation S2 in FIG. 3C. That is, the first etch-back process is carried out by using a mixed gas of $CF_4$ gas and $O_2$ gas, and this use of the mixed gas induces an isotropic dry etching of the second polysilicon layer 42. Also, as a result of this isotropic dry etching, the initially generated seams S1 are removed, producing the remaining seams S2. At this time, during the first etch-back process, if a chamber pressure is maintained in a range from approximately 500 mtorr to approximately 2,000 mtorr, the initially generated seams S1 can be removed with improved efficiency.

If a second etch-back process is performed without removing the initially generated seams S1, it is impossible to eliminate the height difference between the gate hard mask layer 35 and the second polysilicon layer 42. For this reason, the first etch-back process is applied under the recipe that provides the isotropic dry etching characteristic.

Figure 3D:
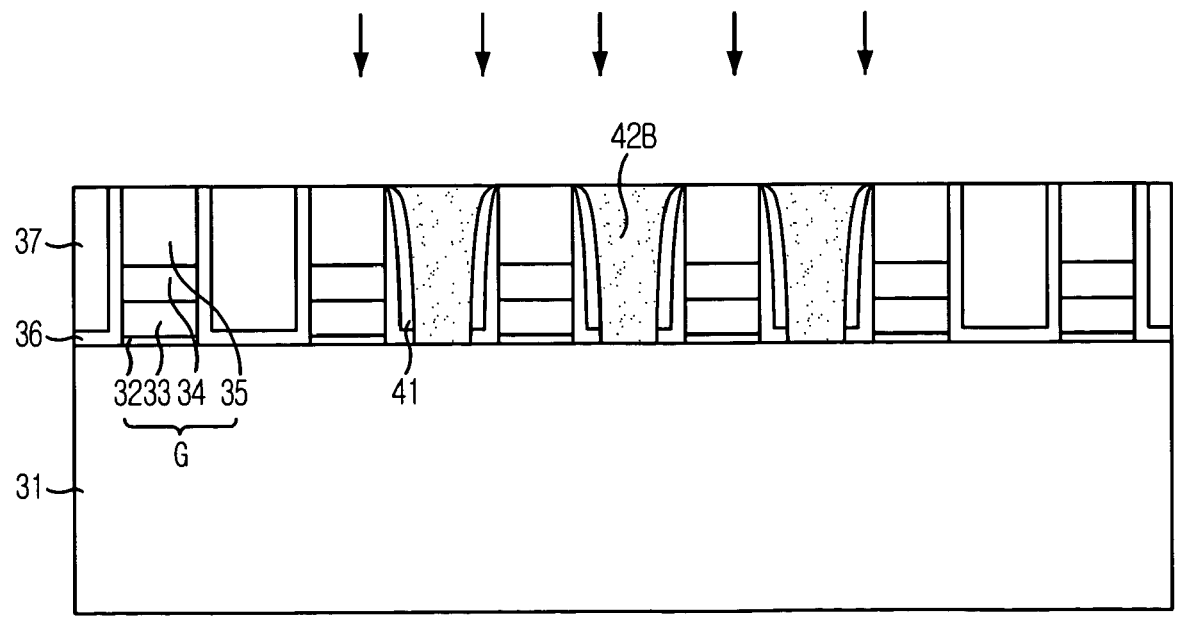

Referring to FIG. 3D, a second etch-back process is performed for isolating the LPCs, i.e., portions of the remaining second polysilicon layer 42A of FIG. 3C. That is, through the second etch-back process, portions of the remaining second polysilicon layer 42A are isolated from each other while being filled into the contact holes 40. These isolated portions of the remaining second polysilicon layer 42A are the aforementioned LPCs 42B. Also, during the second etch-back process, the first polysilicon layer 38 is simultaneously removed.

The second etch-back process is carried out by using a mixed gas including a first gas and a second gas. The first gas is selected from a group consisting of $C_2F_6$, $CF_4$, $C_4F_8$, $C_5F_8$, $C_4F_6$, $CH_2F_2$, $C_3F_8$ and $CHF_3$, and the second gas is selected from a group consisting of HBr, $Cl_2$, $BCl_3$, $SF_6$, and $NF_3$. Especially, mixing the first gas and the second gas gives an anisotropic dry etching characteristic. It is also preferable to control the recipe of the second etch-back process such that the gate hard mask layer 35 is etched at a rate ratio ranging from approximately 0.5 to approximately 10 with respect to the remaining second polysilicon layer 42A for which the ratio is set at approximately 1. As a result, an incidence of the height difference does not arise.

If the second etch-back process is carried out under the recipe that gives the isotropic dry etching characteristic similar to the first etch-back process, it is difficult to obtain an intended level of the etch selectivity between the gate hard mask layer 35 and the remaining polysilicon layer 42A. Hence, the height of the gate hard mask layer 35 may be different from that of the resulting LPCs 42B. That is, a higher amount of the remaining second polysilicon layer 42A is etched.

However, as described above, if the second etch-back process utilizes such recipe that gives the anisotropic dry etching of the remaining polysilicon layer 42A, the gate hard mask layer 35 has the etch selectivity ratio ranging from approximately 0.5 to approximately 10 with respect to the remaining second polysilicon layer 42A for which the etch selectivity ratio is set at approximately 1. Through the etch-back process capable of controlling the etch selectivity ratio between the etch target materials, the LPCs 42B can be isolated without creating the height difference between the gate hard mask layer 35 and the resulting LPCs 42B. Since the initially generated seams S1 are already removed through the first etch-back process, the incidence of the height difference between the gate hard mask layer 35 and the individual LPC 42B is further reduced.

Although the preferred embodiment of the present invention shows the case of using the polysilicon layer as the LPC, other types of conductive materials used as the LPC can be applicable. For instance, tungsten is commonly used as such conductive material for forming the LPC. At this time, as in the disclosed preferred embodiment, the first etch-back process is performed to remove the initially generated seams by applying the recipe that give the isotropic dry etching characteristic. Then, the second etch-back process for forming the LPCs is carried out under another recipe that gives the anisotropic dry etching characteristic, so that the LPCs are isolated from each other.

In accordance with the preferred embodiment of the present invention, the etch-back process for forming the LPCs is performed in two steps, and this specific proceeding of the etch-back process makes it possible to prevent creation of a height difference between the gate hard mask layer and the LPC material, i.e., the second polysilicon layer. As a result of this effect, it is possible to secure a self-aligned contact (SAC) margin for a SAC etching process for forming subsequent bit line contact holes. Further, it is possible to improve device reliability and semiconductor device yields.

The present application contains subject matter related to the Korean patent application No. KR 2004-0113522, filed in the Korean Patent Office on Dec. 28, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a landing plug contact in a semiconductor device, comprising the steps of:
    forming a plurality of gate structures on a substrate, each gate structure including a gate hard mask;
    forming an inter-layer insulation layer over the gate structures;
    planarizing the inter-layer insulation layer until the gate hard mask is exposed;
    forming an etch barrier layer on the inter-layer insulation layer;
    etching a predetermined portion of the inter-layer insulation layer by using the etch barrier layer as an etch barrier to form a plurality of contact holes;
    forming a polysilicon layer for forming the landing plug contacts until the polysilicon layer fills the contact holes;
    removing surface roughness created during the formation of the polysilicon layer by a first etch-back process which ends before the gate hard mask is exposed, wherein the first etch-back process is carried out under a first recipe that gives an isotropic dry etching of the polysilicon layer; and
    planarizing the polysilicon layer by a second etch-back process until the gate hard mask is exposed, wherein the second etch-back process is carried out under a second recipe that gives an anisotropic dry etching of the polysilicon layer,
    wherein the recipe for the first etch-back process uses a mixed gas of $CF_4$ gas and $O_2$ gas.

2. The method of claim 1, wherein the recipe for the first etch-back process includes a chamber pressure maintained in a range from approximately 500 mtorr to approximately 2,000 mtorr.

3. The method of claim 1, wherein the recipe for the second etch-back process uses a mixed gas including a first gas selected from a group consisting of $C_2F_6$, $CF_4$, $C_4F_8$, $C_5F_8$, $C_4F_6$, $CH_2F_2$, $C_3F_8$ and $CHF_3$ and a second gas selected from a group consisting of HBr, $Cl_2$, $BCl_3$, $SF_6$, and $NF_3$.

4. The method of claim 1, wherein the second etch-back process uses an etch gas obtained by mixing a first gas selected from a group consisting of $C_2F_6$, $CF_4$, $C_4F_8$, $C_5F_8$, $C_4F_6$, $CH_2F_2$, $C_3F_8$, and $CHF_3$ with a second gas selected from a group consisting of HBr, $Cl_2$, $BCl_3$, $SF_6$, and $NF_3$.

5. The method of claim 1, wherein the gate hard mask is formed by employing nitride.

6. The method of claim 1 wherein the second etch-back process controls the recipe such that the gate hard mask has an etch selectivity ratio ranging from approximately 0.5 to approximately 10 with respect to the polysilicon layer of which etch selectivity ratio is set at approximately 1.

7. The method of claim 1, wherein the forming of the etch barrier layer on the inter-layer insulation layer includes:
    forming another polysilicon layer for forming a hard mask over the inter-layer insulation layer;
    forming a photoresist layer on said another polysilicon layer;
    patterning the photoresist layer through a photolithography process to thereby obtain a landing plug contact mask;
    patterning said another polysilicon layer by using the landing plug contact mask as an etch barrier; and
    stripping the landing plug contact mask.

8. A method for forming a landing plug contact in a semiconductor device comprising the steps of:
    a) selectively etching a portion of an inter-layer insulation layer using a patterned first insulation layer as an etch barrier to form a plurality of contact holes;

b) forming a conductive layer over the structure resulting from said step a) to fill the contact holes;

c) performing an etch-back process on the conductive layer to open the contact holes;

d) forming a second insulation layer on the structure resulting from said step c) until the contact holes are filled;

e) performing a first etch back process on the second insulation layer to remove surface roughness, wherein the first etch-back process ends before the gate hard mask is exposed and the first etch-back process is carried out under a first recipe that gives an isotropic dry etching of the conductive layer; and f) performing a second etch-back process on the structure resulting from said step e) to isolate the landing plug contacts and to fill the contact holes until the gate hard mask is exposed, wherein the second etch-back process is carried out under a second recipe that gives an anisotropic dry etching of the conductive layer.

9. The method of claim 8 wherein the second etch-back process controls the recipe such that a gate hard mask has an etch selectivity ratio ranging from approximately 0.5 to approximately 10 with respect to the polysilicon layer of which etch selectivity ratio is set at approximately 1.

* * * * *